United States Patent [19]

Herrell et al.

[11] Patent Number: 4,860,444
[45] Date of Patent: Aug. 29, 1989

[54] METHOD OF ASSEMBLING A FLUID-COOLED INTEGRATED CIRCUIT PACKAGE

[75] Inventors: Dennis J. Herrell; David A. Gibson, both of Austin, Tex.

[73] Assignee: Microelectronics and Computer Technology Corporation, Austin, Tex.

[21] Appl. No.: 175,784

[22] Filed: Mar. 31, 1988

Related U.S. Application Data

[62] Division of Ser. No. 846,087, Mar. 31, 1986, Pat. No. 4,758,926.

[51] Int. Cl.⁴ .............................................. H05K 3/34
[52] U.S. Cl. .................... 29/840; 29/402.03; 228/187; 357/74; 357/81
[58] Field of Search ............... 29/840, 402.03; 361/385; 174/16 HS, 52 FP; 357/81, 74; 228/187, 121, 179

[56] References Cited

U.S. PATENT DOCUMENTS

| | | | |
|---|---|---|---|
| 4,233,644 | 11/1980 | Hwang et al. | 174/16.3 |
| 4,506,108 | 3/1985 | Kersch et al. | 174/52.4 |
| 4,515,304 | 5/1985 | Berger | 228/187 |
| 4,573,067 | 2/1986 | Tuckerman et al. | 357/82 |
| 4,631,636 | 12/1986 | Andrews | 357/82 |
| 4,646,129 | 2/1987 | Yerman et al. | 357/81 |
| 4,700,879 | 10/1987 | Weidenawer | 228/187 |

OTHER PUBLICATIONS

Manko, Howard H., Solders and Soldering, 2nd ED., p. 136, McGraw-Hill, Apr., 1980.

*Primary Examiner*—P. W. Echols
*Attorney, Agent, or Firm*—Fulbright & Jaworski

[57] ABSTRACT

A package for enclosing, protecting and cooling semiconductor integrated circuit chips. The package includes a generally planar substrate with the chips positioned thereon. Signal connections are provided between at least some of the chips. A heat sink is positioned in contact with the chips and includes microchannels through which a cooling fluid flows for purposes of transferring heat generated by the chips to such fluid. Manifolds are provided to direct the fluid to and from the microchannels, and microcapillary slots may be formed on the heat sink surface adjacent the chips to receive liquid to generate attractive forces between the heat sink and chips to facilitate heat transfer. Circuitry is provided to distribute power through the package and to the chips.

3 Claims, 5 Drawing Sheets

METHOD OF ASSEMBLING A FLUID-COOLED INTEGRATED CIRCUIT PACKAGE

CROSS-REFERENCE TO RELATED APPLICATIONS

This is a division of application Ser. No. 846,087, filed Mar. 31, 1986, now U.S. Pat. No. 4,758,926.

BACKGROUND OF THE INVENTION

This invention relates to a high performance package providing fluid cooling means for relatively high density semiconductor integrated circuits. The objects of high performance packages in general are severalfold:

(1) the protection of semiconductor chips, i.e. integrated circuits, from contamination such as moisture, salt and the like and mechanical stresses that might fracture the chips or alter component values;

(2) the provision of electrical power to the chips;

(3) the removal of waste heat caused by the operation of the chips;

(4) interconnection of chips by means of large numbers of electrical signal transmission lines;

(5) since integrated circuits are typically simply components of computers, provision must be made for the signals, power and cooling connections of the package to connect with other portions of the computer;

(6) provision must be made for repair of failed chips with minimum disturbance of parts in the package not requiring repair; and (7) the packing of chips as densely as possible to shorten the length of signal transmission lines between chips thereby increasing overall speed of a computer.

Heretofor, numerous proposals have been made for the design of semiconductor chip packages with heat sinks for waste heat removal purposes. For example, a package module for a single chip was proposed in IBM Technical Disclosure Bulletin, Volume 24, No. 1A, June 1981. Therein it was suggested that the chip be back-bonded to a high thermal conductivity material heat sink. Electrical and power connections to the chip were made using thin film wiring and flexible leads.

Air-cooling fins for purposes of cooling high density integrated circuits package also have been proposed. For example, the article entitled "High Thermal Conduction Package Technology for Flip Chip Devices" by Kohara, et al., appeared in *IEEE Transactions on Components, Hybrids and Manufacturing Technology,* Volume CHMT-6, No. 3, September 1982. However, air-cooling has severe limitations in that only small amounts of waste heat may be dissipated, and present and future design considerations for very high density chip packages necessitate removal of significantly higher amounts of heat to maintain junction temperatures at suitable levels.

Fluid-cooled integrated circuit packages offer distinct advantages based on simplicity, efficiency and lack of corrosive qualities within a closed system. Such a package is disclosed in an article entitled "Integral Liquid-Cooling System Simplifies Design of Densely Packaged Computer" by Edward A. Wilson, *Electronics,* Jan. 26, 1984, pages 123 et seq. Here an integral cooler is proposed to which micro packages may be added or removed as desired. The micro packages are mounted on printed circuit boards serving as back panels in turn attached to the integral coolers. Water enters mainfolds at the bottom of the coolers and flows in parallel through the columns of the coolers to be collected at the top.

Another water-cooled system is the IBM Cold-Plate Cooled Thermal Conduction Module (TCM) illustrated in the article entitled "Thermal Management of Large Scale Digital Computer" by Chu et al., *The International Society For Hybrid Microelectronics,* Volume 7, No. 3, September 1984. The TCM consists of a large number of integrated circuit chips with a spring-loaded piston touching each chip and a water-cooled cold plate bolted to the package housing. Heat is conducted from the chips into the pistons and then through the housing and out to the water-cooled plate. The thermal paths from chips to piston and from piston to housing may be enhanced by the use of helium gas.

Variations on the TCM form of package are illustrated in U.S. Patents Nos. 4,381,032 and 4,531,146. Both patents illustrate high density integrated circuit package devices having cooling chambers. A fluid coolant is passed through the chamber under pressure. The cooling chamber in each case is adjacent to and in biased contact with integrated circuits so as to conduct heat away therefrom. These packages have certain serious drawbacks, one being the relatively large physical size required to accommodate even a small number of densely packed integrated circuits. Furthermore, while the packages may accommodate relatively large amounts of cooling fluid, there is a small amount of heat exchange surface between each integrated circuit package and the coolant presenting a significant limitation on the total amount of waste heat that may be removed in each package.

The use of integral liquid-cooled heat sinks in multichip systems has been the subject of an in-depth review by David B. Tuckerman as presented in his dissertation entitled *Heat-Transfer Microstructures for Integrated Circuits,* Stanford University, February 1984. Also, Dr. Tuckerman and Dr. R. F. W. Pease have collaborated in investigating compact, high-performance forced liquid cooling of planar integrated circuits as reported, for example, in an article entitled "High-Performance Heat Sinking for VLSI," *IEEE Electron Device Letters,* Volume EDL-2, No. 5, May 1981. They have suggested the use of silicon as a suitable heat sink material into which may be sawed or etched microscopic channels for cooling fluid to flow to remove waste heat from the integrated circuits. Because of the small size of the channels, they are referred to as "microchannels". Cooling fluid may be uniformly distributed among the channels by means of headers or manifolds communicating with an external source of the fluid. Also suggested is a microcapillary thermal interface concept wherein capillary channels are provided in the heat sink surface adjacent to each integrated circuit. A limited amount of interfacial liquid partially fills the capillaries to provide a well-defined attractive (suction) force due to the liquid's surface tension. The capillary action promotes closer contact of the integrated circuits with the heat sink for improved heat exchange function.

BRIEF SUMMARY OF THE INVENTION

The present invention is directed to a low profile package for high density integrated circuits with liquid cooling for the efficient removal of waste heat caused by operation of the integrated circuit chips. The package is small in size, i.e. low profile, which allows a plurality of the packages to be located closer together, such as by stacking, with closer location of power capacitors to chips resulting in lower inductance and therefor lower transient voltage disturbances (delta-I noise), and a direct current path with lower resistance for power input to capacitors. Of course, the package of the present invention provides all of the objectives of high performance packages enumerated at the outset of this application.

The package of the present invention is formed of sub-assemblies not only for ease of initial assembly but also for ease of partial disassembly for repair of defective semiconductors or other components without sacrificing structural integrity and without destruction of any components of the package. One sub-assembly comprises a generally planar substrate having signal interconnecting means and to which are mounted discrete integrated circuits or chips. A heat sink in a parallel plane with the substrate comprises another sub-assembly, the heat sink carrying microchannel means for fluid flow therethrough in juxtaposition with each of the integrated circuits and manifold means for delivery of a cooling fluid to and from the microchannel means. Unique provision is made for distributing power to the integrated circuits with practically no additional encumbrance on space within the package. Preferably, microcapillary slots are formed on a heat sink surface adjacent the integrated circuits to receive a liquid to generate an attractive force between the heat sink and each integrated circuit chip.

Thus, the advantages of the Tuckerman and Pease proposed liquid cooling of integrated circuits by means of microchannels is combined with a unique configuration for an enclosed package, multiples of which may be easily and efficiently accommodated within a computer to promote high speed operation thereof by virtue of short signal transmission lines and effective removal of waste heat generated from the operation of the chips.

It is, therefore, an object of the present invention to provide a fluid-cooled integrated circuit package.

Another object of the present invention is the provision of a fluid-cooled integrated circuit package comprised of sub-assemblies including a substrate for the integrated circuits with signal interconnecting means, a heat sink assembly with microchannel means and manifold means for flow of a coolant through the heat sink assembly, means for distributing power to the integrated circuits, and means for enclosing the package.

Still another object of the present invention is the provision of microcapillary slots formed on a surface of the heat sink to receive a liquid and thereby provide low thermal resistance between the heat sink and each of the integrated circuits.

Yet another object of the present invention is the provision of a method of assembling as well as disassembling the protective package of the present invention by means of a plurality of solders each having different melting points.

Still another object of the present invention is the provision of such a method so that disassembly may be accomplished to repair components of the package without destruction or damage to the package structure.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

Figure 1:
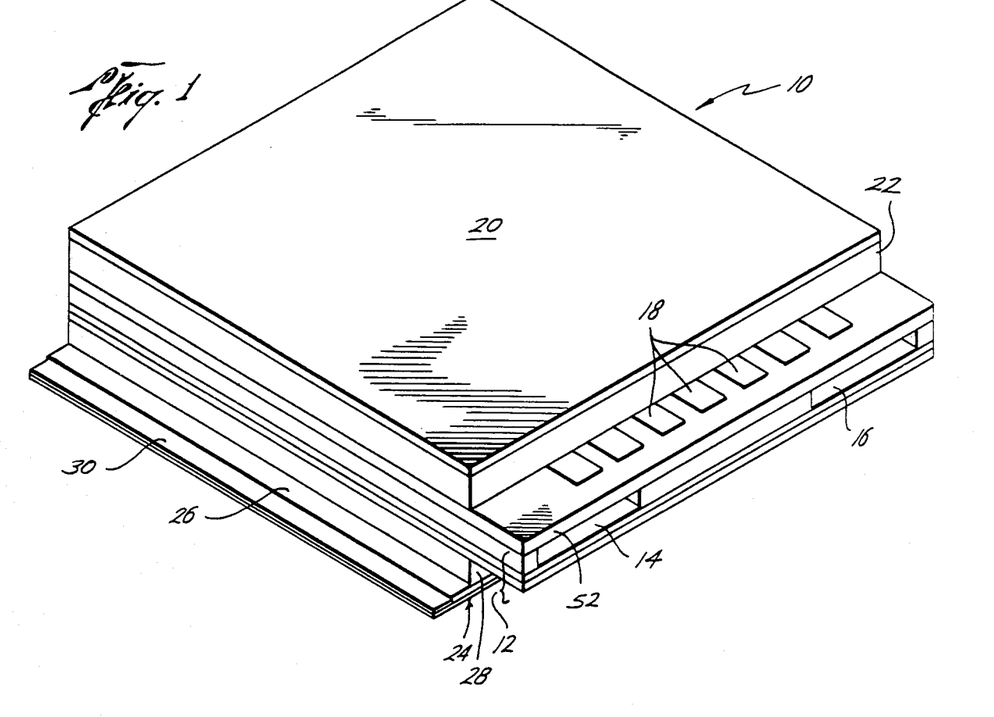
FIG. 1 is a perspective view of a fluid-cooled integrated circuit package according to the present invention.

Referring now to the drawings, and particularly to FIG. 1, the integrated circuit package 10 of the present invention is of a generally planar configuration formed of layered subassemblies with external terminals for signal connections, power connections and connection to a source of cooling fluid. The generally planar package permits the use of the layered stacking of numerous such packages within the confines of a computer. As indicated previously, dense packaging of the integrated circuit chips as well as dense packing of chip packages such as that of the present invention promotes overall speed of a computer by decreasing the length of transmission lines. The package of the present invention provides the advantage of a low profile liquid cooling hat which allows packages to be located closer together in stacking fashion. It also allows closer location of power capacitors to chips resulting in lower inductance and therefore lower transient voltage disturbances (i.e., delta-I noise), and lower direct current resistance path for power input to capacitors.

With reference again to FIG. 1, the package 10 includes a heat sink assembly 12 with an opening 14 to receive cooling fluid from an external source and an opening 16 through which the cooling fluid is discharged. The terminal ends 18 of metal buss strips provide external power connections and are carried on the upper portion of the heat sink assembly 12. A cover 20 and square gasket 22 enclose the upper portion of the package. The substrate assembly 24 includes a generally planar layer 26 secured to the heat sink assembly by means of a square seal 28. Opposed ends of the substrate 24 also include signal terminals, the signal terminal 30 being shown in FIG. 1.

Figure 2:
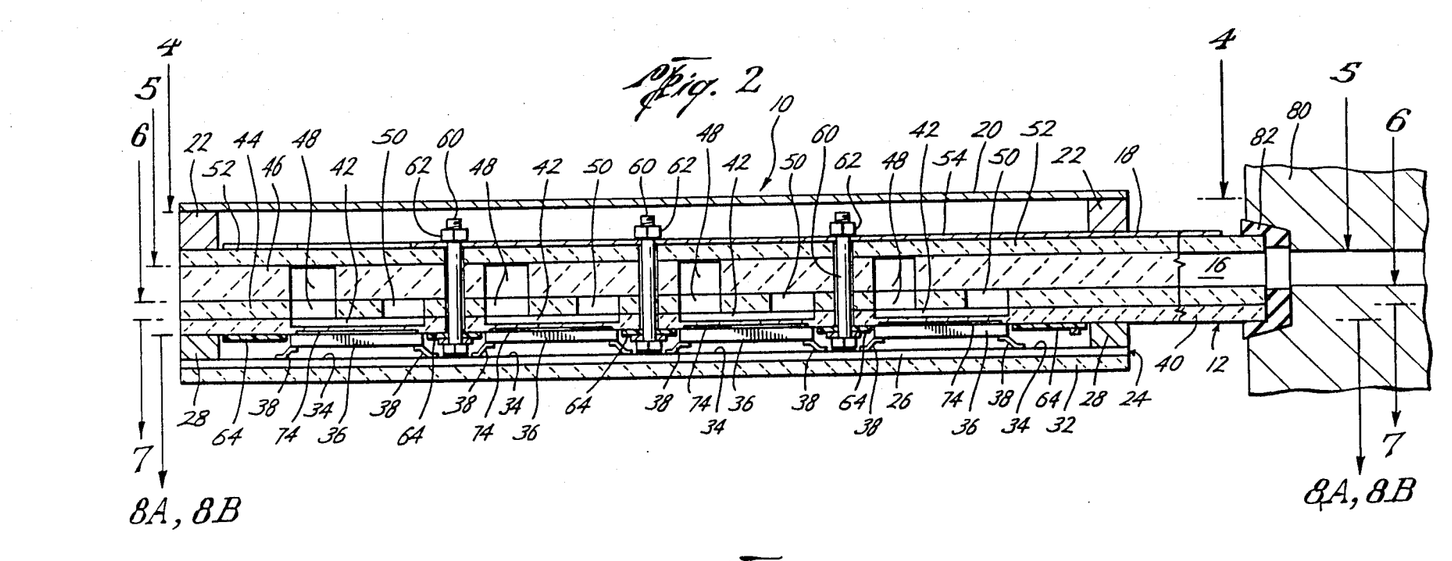
FIG. 2 is a cross-sectional elevational view of the integrated circuit package of the present invention, taken along the line 2—2 (staggered) of FIG. 5.
Figure 3:
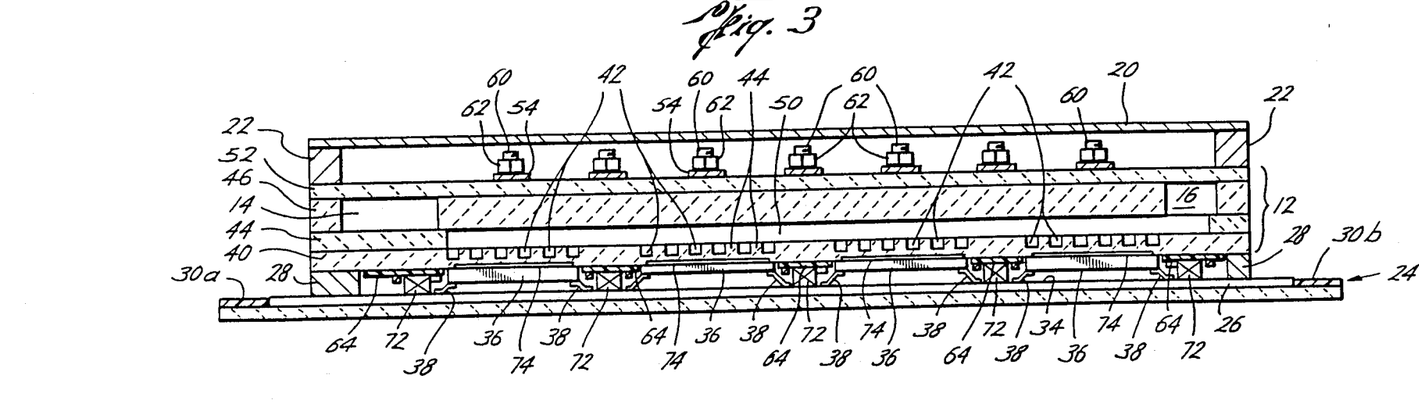
FIG. 3 is a cross-sectional elevational view of the integrated circuit package of the present invention, taken along the line 3—3 of FIG. 5.

Referring next to the substrate assembly 24 carrying the integrated circuits as shown in FIGS. 2 and 3, a generally planar substrate layer 26 preferably formed of a wafer of silicon may be attached to and supported on still another such layer 32. A multi-layer interconnect (not shown in the drawings) is formed on the surface 34 of the substrate layer 26. Preferably, the substrate-with-interconnect is fabricated by starting with a substrate wafer nominally of, for example, 25 mil thick silicon so as to use conventional silicon integrated circuit process techniques to form the interconnect. The interconnect is formed conventionally by adding alternating layers of metal and insulator, each photolithographed to provide an electrical interconnect pattern composed of top and bottom ground planes, transmission lines between the ground planes, metal posts through insulator to provide electrical connection between metal layers, and pads. Pads of solder-plated metal islands may be positioned in the top ground plane. The use of photolithography permits up to 1000 lines per inch patterns.

Figure 8A:
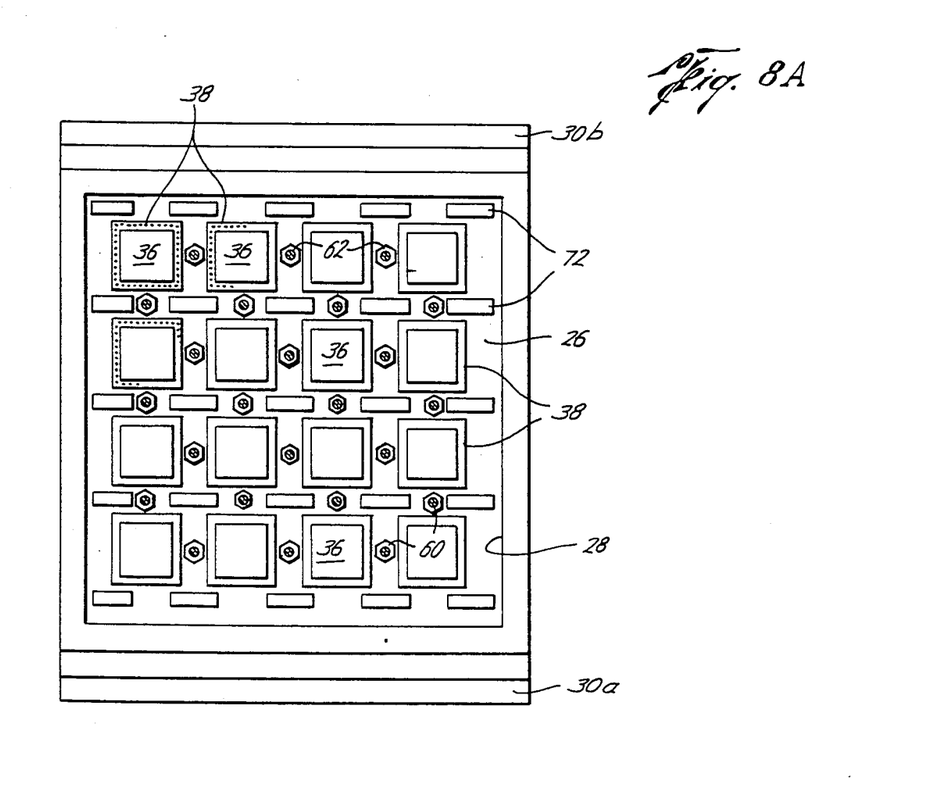
FIG. 8A is a cross-sectional plan view taken along the line 8A—8A of FIG. 2 illustrating the upper portion of the planar substrate assembly, integrated circuit chips, power studs and capacitors of the present invention.

With respect once again to FIGS. 2 and 3 of the drawings, semiconductor integrated circuit chips each represented by the reference character 36 are soldered or bonded to pads (not shown, but described above) on the surface 34 of the substrate 26. Different lateral sizes and thicknesses of chips can be accommodated, and it is not necessary that the chip array be regular or square. While not all chips can be used in the package of the present invention, nevertheless all chips that can be mounted by Tape Automated Bonding (TAB) can be used as well as chips mounted by other compliant means or by use of a compliant interconnect. Final wafer processing of the chips is adjusted to accommodate Tape Automated Bonding by plating up metal on the pad areas to form bumps. The back side of the wafer (opposite the transistor side) should be processed to provide a surface which is smooth to within 3 micrometers. This process also may thin the wafer from, for example, a nominal 25 mils, to about 10 mils or thicken it by the deposition of a thin metal layer. Conventional processes may be used to accomplish this, and for present purposes, need only leave a smooth surface. The wafer is then diced into chips and bonded to TAB tape. TAB tape, of course, is one or more layers of patterned metal, usually copper, adhered to one or more layers of insulator, usually polyimide, and with a radial pattern of metal leads isolated from each other by air gaps and supported by insulator. The TAB tape process is conventional, and the tape itself is not illustrated in any of the drawings herein. However, leads connected to the bumps on the chips are collectively indicated in the drawings by the referenced character 38, particularly as shown in FIGS. 2, 3 and 8A. Preferably, the leads are formed in a step shape as illustrated in FIGS. 2 and 3 to permit the selection of different amounts of bend and thus accommodate chips standing selected heights above the surface 34 of the substrate 26. The amount of bend in forming the leads 38 in step fashion is made larger for thinner chips 36 so that the back of each chip will stand at some nominal height above the substrate 26 as, for example, 35 mils plus or minus one mil. In this way, chips of different thicknesses such as between 10 and 20 mils can be accommodated with TAB lead step heights of 25 to 15 mils such that the sum is a nominal 35 mils.

Continuing with respect to FIGS. 2 and 3, the heat sink assembly 12 is in a plane generally parallel with the plane of the substrate assembly 24. The heat sink includes microchannel means formed in the heat sink structure and adapted for fluid flow therethrough in juxtaposition with each of the integrated circuits 36. Preferably, the heat sink assembly is formed of a plurality of parallel layers of silicon. As shown in FIG. 3, the layer 40 is provided with a plurality of microchannels (each represented by the reference character 42) formed therein to receive a cooling fluid and located adjacent to the integrated circuits 36 so as to conduct heat away from the chips. The microchannels 42 are slots that are sawed, etched or otherwise formed preferably about half way through the layer 40. If the layer 40 is 25 mils thick, the microchannels may be 9.3 mils deep (about 240 $\mu$m) each with a lateral dimension of nominally about 80 $\mu$m wide. Obviously, the microchannels 42 and fins 44 illustrated in FIG. 3 are not to scale because of the small dimensions involved. Generally speaking, these dimensions are determined by designing for a temperature rise of 5° Celsius across an integrated circuit chip one centimeter square at a chip power dissipation of 50 watts per square centimeter with a pressure drop of 340,000 dynes/cm$^2$ (5 pounds per square inch) and a flow rate of 2.4 grams of water per second for a square array of channels one centimeter by one centimeter. This results in a heat sink thermal resistance of about 0.3 to 0.6° C-cm$^2$/watt between transistors and water. The dissertation by Tuckerman and the journal article by Keyes noted at the outset hereof are commendable sources for further explanation of dimensional analysis and the like.

Figure 7:
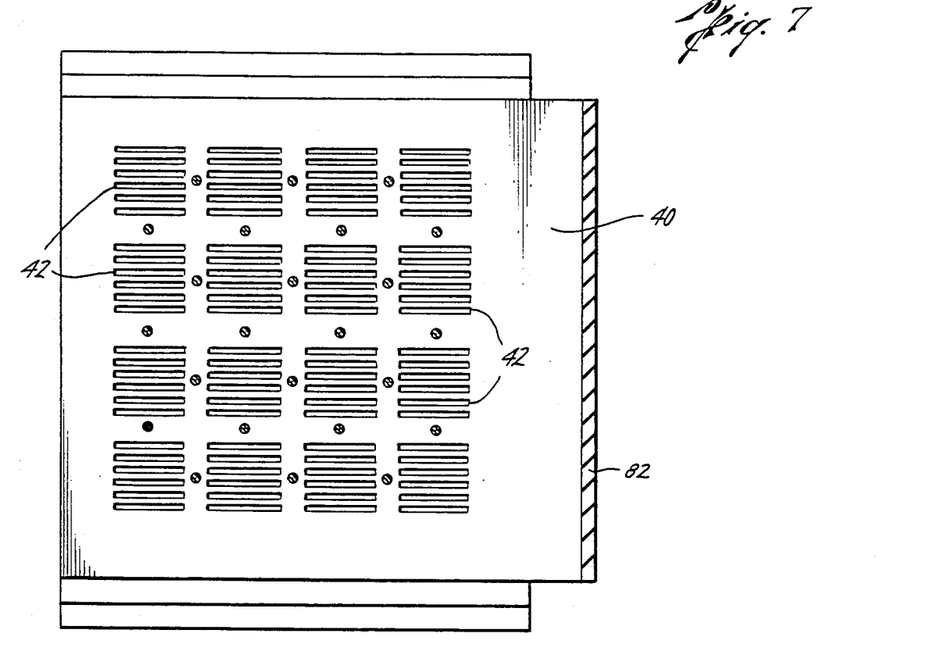
FIG. 7 is a cross-sectional plan view taken along the lines 7—7 of FIG. 2 illustrating the microchannels formed in a layer of the heat sink assembly positioned adjacent to and in juxtaposition with the integrated circuits of the present invention.

The microchannels 42 are further illustrated in FIG. 7. As shown in that drawing, the microchannels are grouped, and each array or group is sized and positioned so as to correspond with the integrated circuit chips adjacent thereto and underneath as viewed in FIG. 7.

Figure 5:
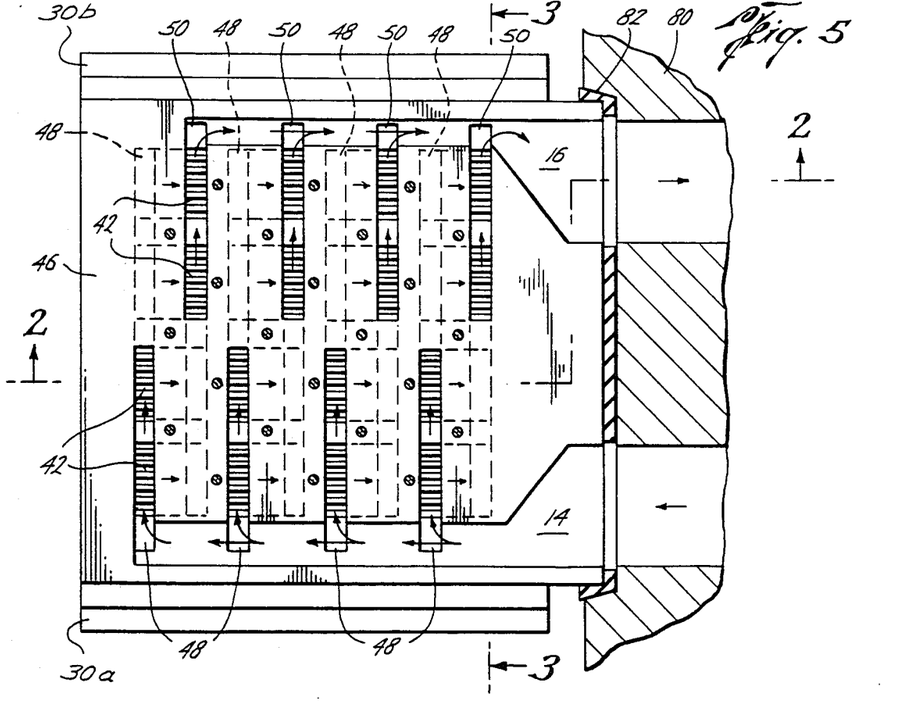
FIG. 5 is a cross-sectional plan view taken along the line 5—5 of FIG. 2 and illustrating a portion of the heat sink assembly and the manifolds and microchannels for distributing a cooling fluid through the package of the present invention.
Figure 6:
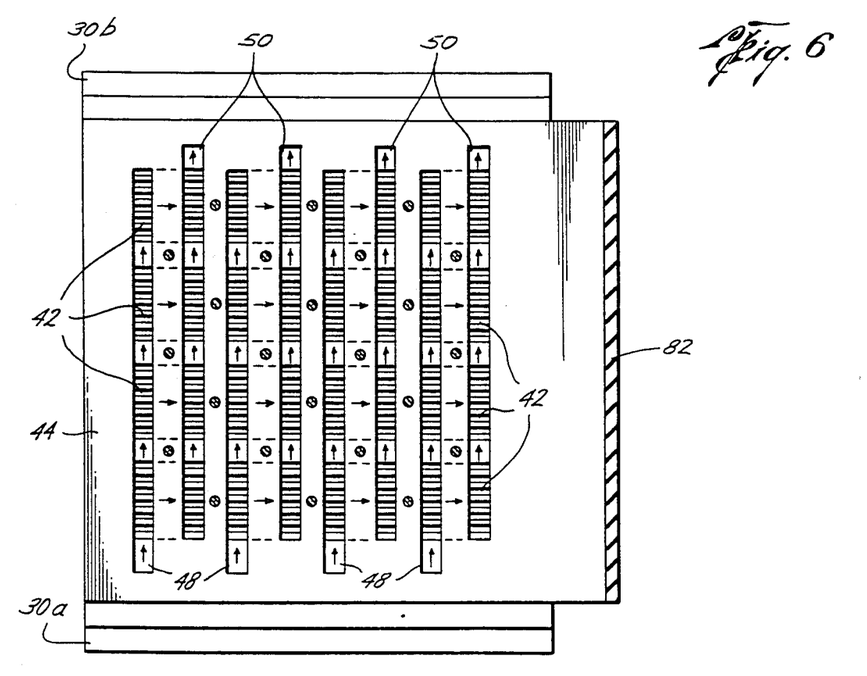
FIG. 6 is a cross-sectional plan view taken along the lines 6—6 of FIG. 2 illustrating another portion of the heat sink assembly, manifolds and microchannels of the present invention.

With reference to FIGS. 5 and 6, the microchannels 42 preferably are formed in groupings as illustrated in the drawings. The microchannels in each group have parallel axes, and opposed ends of each microchannel in each grouping are in fluid communication with manifolds formed in other layers of the heat sink for delivery of a cooling fluid to and from each of the microchannels. Referring also to FIGS. 2 and 3, silicon layers 44 and 46 have formed therein manifolds 48 through which cooling fluid is conducted from the fluid inlet 14 whereupon the fluid enters the manifolds 48 and thence passes into the microchannels 42. The cooling fluid flows axially through each microchannel 42 and then into one of several outlet manifolds 50 and thence into the fluid outlet 16. Preferably, the layers 44 and 46 having the manifolds 48 and 50 formed therein are two separate layers, although it will be appreciated that either a single or still additional layers may be used for purposes of forming entrance and exit manifolds for communication with the microchannels 42.

As shown in FIGS. 2 and 3, still another layer, preferably of silicon, represented by the reference character 52 functions as a cover for the manifolds 48 in the layer 46. The cover layer 52 also serves as a support for metal buss strips 54 for power distribution purposes as will be explained hereafter.

Figure 4:
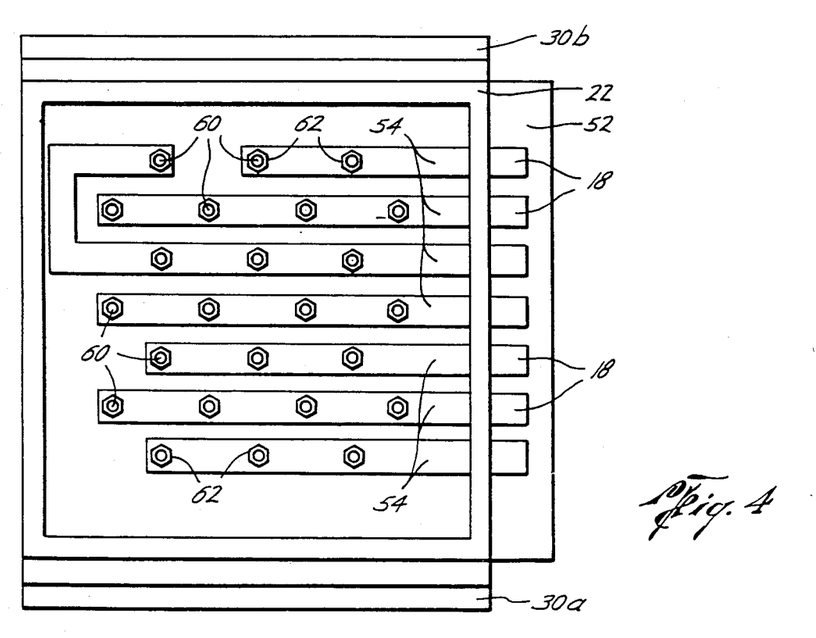
FIG. 4 is a cross-sectional plan view of the present invention with cover removed to show a portion of the power distribution means.

Means are provided for distributing power to the integrated circuit chips 36. As illustrated in FIG. 1, power is received from an external source via the connectors 18. As illustrated in FIG. 4, the connectors 18 preferably are continuous extensions of the electrically conducting metal buss strips 54 that may be used to selectively connect with a plurality of metal stud or bolt members 60. As shown in FIGS. 2 and 3, the upper end of each stud member 60 may be threaded to receive a nut 62 to retain each metal buss strip 54 in a secure position. Electricity thus is conducted through each of the stud members 60 to power redistribution decal means indicated in FIGS. 2 and 3 by the reference character 64. The power distribution decal 64 may be photolithographed copper on a layer of polymeric insulator such as polyimide.

The pattern of studs shown in FIGS. 4, 5, 6, 7, 8A and 8B is only one possible arrangement. If the lower gasket 28 is made flexible, then it is desirable to add studs next to chips at the perimeter of the array of chips. This requires a small increase in package size and relocation of the upper manifolds back from the array by two to three millimeters each side.

Figure 8B:
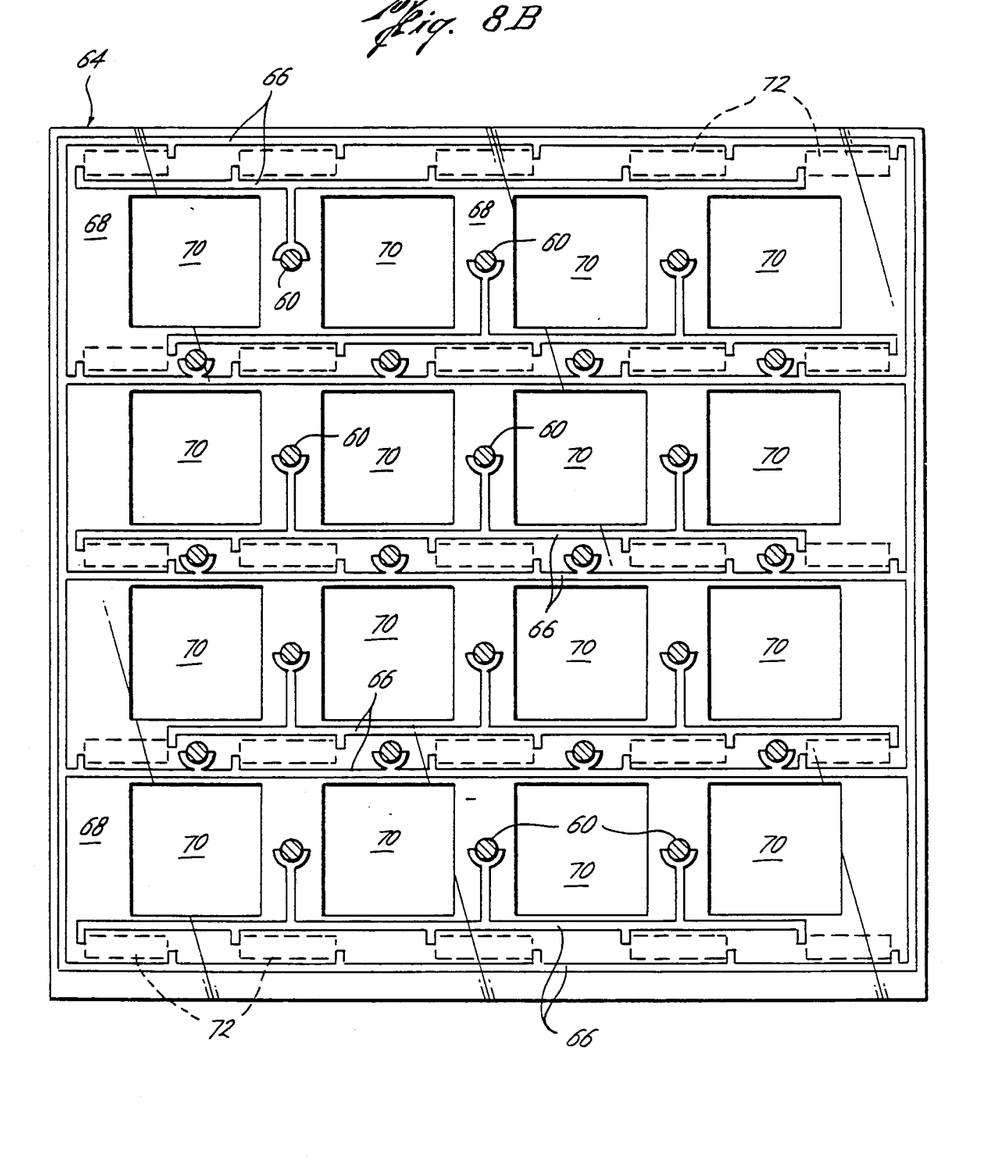
FIG. 8B is a partial cross-sectional plan view taken along the line 8B—8B of FIG. 2 illustrating the power redistribution tape or decal of the present invention with openings to accommodate the integrated circuit chips.

As shown in FIG. 8B, the power redistribution decal includes copper conductors 66 in conductive engagement with each metal stud member 60. The insulator layer is indicated by the reference character 68. Rectangular holes 70 are punched out of the decal for clearance of each of the chips 36 as are holes for each of the bolts or studs 60. As shown in FIG. 8B, each of the copper conductive strips 66 conductively communicates with capacitors 72 (shown in phantom in FIG. 8B). Preferably, the contact ends of each of the capacitors are pre-tinned to permit intimate contact with the metal pattern 66 of the power redistribution decal 64. The capacitors 72 also are illustrated in FIG. 8A. Preferably, the capacitors 72 are soldered to the substrate interconnect on the surface 34 of the substrate layer 26 as shown in FIG. 3. Electrical power thus may be conducted from each capacitor to certain of the leads 38 and thence to each semiconductor chip.

In the preferred embodiment of the present invention, microcapillary slots each having a depth of from about 4 to about 10 $\mu$m and from about 3 to about 5 $\mu$m wide and of a length corresponding with a lateral dimension of each integrated circuit are formed in groups on a surface of the layer 40 of the heat sink assembly opposed from the microchannels 42. The microcapillary slots are indicated by reference character 74 in FIGS. 2 and 3 and function to receive a liquid such as an oil to generate attractive forces between the silicon layer 40 and each of the integrated circuits 36. The attractive capillary forces thus generated hold each integrated circuit chip 36 in intimate contact with the layer 40 to facilitate the conduction of waste heat away from each chip 36, through the layer 40 and then to cooling fluid flowing through each of the microchannels 42. Optionally, a metal layer may be plated or deposited approximately 1 $\mu$m thick onto the microcapillaries to provide a reentrant geometry, that is, narrower openings to the capillaries 74 than the width of each capillary deeper below the silicon surface as described by Tückerman et al.

A unique advantage of the package of the present invention is the ease with which it may be disassembled for repair of components therein. Accordingly, the following is an explanation of the preferred assembly steps which promote ease of disassembly. It will be understood, however, that several portions of the package may be pre-assembled, including the bonding of the chips 36 to the TAB tape (not shown in the drawings); the preparation of the multi-layer interconnect on the surface 34 of the substrate layer 26; the fabrication of the layers of the heat sink assembly, including layers 40, 44, 46 and 52; the fabrication of the power redistribution decal 64; and the preparation of various other parts such as the bolts 60, the lid or cover 20, the square gaskets 22 and 28 and surfaces which require the addition of solder of glass layers. Preferably, the substrate assembly 24 and heat sink assembly 12 are separately pre-assembled to keep the integrated circuit chips 34 exposed until final assembly and sealing. The power studs 60 or bolts may be added to either assembly depending on the procedure for final assembly. In the preferred final assembly procedure, the power studs 60 are inserted in the heat sink assembly 12 and held there by the nuts 62. The heat sink assembly 12 is aligned with the substrate assembly 24 carrying the integrated circuit chips 36, and then the cover 20 is aligned to the heat sink assembly. The whole package is temporarily clamped for a single heat cycle that solders the bolt heads, i.e. the lower ends of the power studs 60, to the substrate interconnect on the surface 34, solders the lower square gasket 28 to the layer 40 of the heat sink 12, and solders the lid 20 to the upper square gasket 22 in the same heat cycle.

In an alternate final assembly procedure, the power studs 60 or bolts may be inserted into a jig that holds them in proper position during a first heat cycle to solder them to the substrate-interconnect on the surface 34 of the substrate layer 26. The jig may be removed by sliding it off the power studs 60 whereupon the heat sink assembly 12 is slid on in its place. Then the nuts 62 may be screwed on the bolts 60 and adjusted to flatten all the chips 36 against the heat sink 12 as well as to pull the square gaskets against the heat sink. The lid 20 may be temporarily clamped to the upper square gasket 22, and the entire package thereafter exposed to a second heat cycle to solder the lower square gasket 28 against the heat sink 12 and the lid 20 to the upper square gasket 22.

It should be noted that holding the chips 36 flat and tight against the heat exchange surface of the layer 40 of the heat sink assembly 12 is important to achieving low thermal resistance between each chip and the heat sink.

The technique of soldering as mentioned above and as will be referenced hereafter in the description of assembly and disassembly refers to the use, for example, of tin-lead solder with varying proportions of tin and lead and hence varying melting temperatures. Thus, a hierarchy of solder melting points is used to accomplish assembly and to facilitate non-destructive disassembly. Examples of solders that may be used are mentioned hereafter.

The substrate assembly 24 is prepared with the appropriate signal interconnect means thereon, chips 36 with leads 38 connecting with the interconnect, and signal conductors (not shown extending from the appropriate leads 38 to the external signal connectors 30a and 30b. The power capacitors 72 are soldered to pads (not shown) on the substrate interconnect. As appropriate, resistors (not shown) for transmission line termination also may be soldered to pads on the substrate interconnect.

The lower square gasket 28 is prepared for soldering preferably to a large, solder-plated pad on the surface 34 of the substrate layer 26. Because it is difficult to place solder on the top surface of the gasket once it is attached to the substrate interconnect, solder may be added to the top surface of the square gasket before attachment. The seal solder is applied by plating, paste or preformed to the top surface of the square gasket and it should have a lower melting point than the pad solder on the substrate-interconnect so as to effect reliable separation of the two package halves upon disassembly without causing the chips to detach from the substrate-interconnect. In the initial attachment of the lower square gasket 28 to the substrate interconnect, the seal solder already will be melted at the melting point of the pad-solder. To prevent the loss of seal-solder to alloying with the gasket 28, a thin barrier metal may be required between the gasket body 28 and the solder on its (lower square gasket's) top surface as viewed in FIGS. 2 and 3. A tin-lead solder is an example of a high melting point solder that may be used to connect the leads 38 to the substrate interconnect on the surface 34 and to solder the square gasket 28 to the surface 34. Preferably, the solder should contain approximately 5% tin and 95% lead resulting in a melting point of approximately 288° Celsius. The solder that may be used on the upper surface of the lower square gasket 28 and the upper surface of the upper square gasket 22 may comprise, for example, about 15% tin and about 85% lead, resulting in a melting point of about 232° Celsius. The solder applied to the surface of each integrated circuit chip 36 for attachment to the heat sink assembly preferably comprises about 3.5% silver and about 96.5% tin with a melting point of about 220° Celsius.

The heat sink assembly 12 of the package is assembled from layers of silicon or metal that are patterned to provide the manifolds 48 and 50 as well as the cooling fluid inlet 14 and the cooling fluid outlet 16 and to provide holes for the power studs 60. One method for patterning the layers is conventional photolithography and etch. That is, the manifolds 48 and 50 and power stud holes are etched through each layer of the heat sink. They also may be patterned by conventional bead blasting with a suitable mask. In the preferred embodiment, the heat sink layers are oxidized after forming the manifolds and power stud holes but prior to etching the microchannels 42 and the capillaries 74 so as to provide electrical insulation inside the power stud holes and an oxide layer for anodic bonding in the laminating step described hereafter. The surface oxide can be achieved by anodization, chemical oxidation, or oxidation at high temperature in air, oxygen or steam. As an option to improve heat transfer, the surface oxide may be etched from the capillary side of the layer 40 of the heat sink. The surface oxide should be etched from areas where the microchannels 42 will be etched but left on the tops of the intervening fins 44 (FIG. 3) and surrounding area.

The microchannels 42 and capillary slots 74 may be formed by etching or other conventional means. They are prepared to dimensions as previously described. The next step, lamination of the heat sink layers, preferably is achieved by conventional anodic bonding or alternately by soldering such that no voids are left between the layers. A further requirement of lamination is that the bolt holes should register, which may be achieved by the presence of a few bolts or registration pins in two or more holes during lamination. The pins can be formed of refractory material if the lamination is to occur at high temperature.

Preferably, the power distribution busses, that is, the metal buss strips 54, are arranged so that power may be fed through an hermetic seal at the edge of the upper layer 52 of the heat sink assembly 12. This is most easily accomplished by depositing layers of titanium and tungsten to a thickness of about 0.5 μm each and using conventional photolithography and etch to define the pattern. The upper square gasket may be metal with a glass layer deposited on its bottom surface so that setting the gasket on the heat sink layers at the re-flow temperature of the glass will form a hermetic seal around the titanium-tungsten conductors. After cool down, the exposed titanium-tungsten pattern is plated up with a thick layer of copper.

To assure adherence of the solder stop the lower square gasket to the heat sink undersurface, the deposition of titanium-tungsten layers or a plated nickel layer should be added on the undersurface. These metals should be limited by masking with tape or photoresist to a perimeter border about the width of the lower square gasket.

The power redistribution decal 64 may be conventionally photolithographed copper (form the conductors 66) on a layer of polymeric insulator such as polyimide as previously explained. Also as previously explained, rectangular holes to accommodate the chips and holes for the power studs are punched out of the decal. In the preferred assembly procedure, the power decal 64 is aligned to the bolt holes in the heat sink assembly, the bolts or power studs 60 are inserted in all of the holes in the heat sink, and the nuts 62 are screwed onto all of the threaded power studs ends. The power redistribution decal is clamped (not adhered) between lower heads on each of the power studs 60 and the heat sink 12 to effect electrical contact between each bolt head and the copper pattern on the power redistribution decal 64. The power buss strips 54 are clamped between the nuts 62 and the top of the heat sink 12 to effect electrical contact between the power busses and the nuts. Since the nuts are in electrical contact with the power studs through the threads, electrical current can be transmitted from the power busses to nuts to bolts to power redistribution decal.

In the preferred final assembly procedure, the accuracy of registration of each of the soldered power studs 60 to its respective hole is achieved by use of the sub-assembly of the heat sink 12 with the busses 54, the gasket 28, the power redistribution decal 64, the power studs 60 and the nuts 62 to locate the bolt heads both laterally and vertically while they are being soldered to solder pads on the substrate interconnect on the surface 34 of the substrate layer 26. The accuracy of registration of the bolt heads to the substrate may be improved with two short guide pins (not shown) which are pre-soldered to the substrate at specific locations to mate with corresponding blind holes in the heat sink. As long as the axes of the bolt holes are all parallel, the heat sink can be slid on or off the bolts. The lid or cover 20 is attached in the same heat cycle that solders the bolt heads to the substrate interconnect, the heat sink assembly 12 is aligned to the substrate-interconnect, and the cover 20 is aligned to the heat sink assembly. These pieces are temporarily clamped together to bring the chips 36 into intimate contact with the bottom surface of the heat sink at the locations of capillaries if capillaries are used, and in juxtaposition with the microchannel 42 areas in any case. If solder is used between each chip and the heat sink, its melting temperature should for ease of dis-assembly be the same or less than the melting temperature of solder used on the gasket 28. Simultaneously, the solder-coated top surface of the lower square gasket 28 is brought into intimate contact with the previously described metallized border on the bottom of the heat sink assembly 12. Also, the pre-tinned tops of the contact ends of the capacitors 72 are brought into intimate contact with the metal pattern 66 of the power redistribution decal 64.

The clamped combination of the heat sink assembly 12, the substrate assembly 24 and the lid or cover 20 is heated uniformly such as in an oven with a dry nitrogen atmosphere. Alternatively, the uniformity of heating may be improved such as by pumping nitrogen at the oven temperature through the microchannels 42. During or before heating the cavity in which the chips reside should be evacuated and back-filled with a dry inert gas. Where it is required that the package be hermetically sealed, the dry atmosphere should sealed inside the package. The temperature is raised to the melting temperature of the pad solder, that is, the solder connecting each of the leads 38 from the integrated circuit chips to the interconnect on the surface 34. Since this is the highest melting temperature solder, all solders thus are caused to melt and wet all of the surfaces brought into intimate contact with the solders. This causes the capacitors 72, any resistors (not shown), and the TAB leads 38 connecting with pads on the substrate-interconnect on the surface 34 to remelt, so it is important to orient the entire combination such that gravity's force is normal to the plane of the substrate 24 and not to jar or vibrate the package while at this temperature.

Thereafter, cooling to a temperature such that the pad-lead 38 solder solidifies, leaves the capacitors, resistors, TAB leads 38 and power studs 60 fixed while the solder on the square gaskets is still molten. With further cooling, solder on the square gaskets freezes and the package is complete.

Design considerations for proper compression of the TAB leads 38 so that the chips 36 are held flat and tight to the heat sink bottom surface are as follows. The nominal height above the substrate-interconnect of the sum of the bolt head height and the power redistribution decal thickness should be slightly less than the minimum height of any chip backside above the top surface of the substrate-interconnect. For a chip backside height of 35 mils, plus or minus 1 mil, this minimum height is 34 mils, so the sum of the bolt head height and the power-decal thickness should be slightly less, e.g. 33 mils. With these dimensions, the chip TAB leads 38, which are formed into a step shape, are compressed at least 1 mil and possibly up to 10 mils. The capacitors will be the same height as the bolt heads because the power redistribution decal cover both. No compliance is designed into the capacitor contacts as these are soldered to the substrate-interconnect, and low thermal resistance is not required. However, leaf springs can be soldered to the capicators to provide compliance. The height of the lower square gasket 28 with its layer of solder will be designed to be equal to the sum of the height of the bolt head plus the thickness of the power redistribution decal.

To further insure that the chips 36 are held tightly against the heat sink assembly, the capillary chip attach preferably is used. Alternatively, or in combination with the capillary attach, solder can be used between the chips and the heat sink. The melting point of any such solder should be below that of the final seal-solder which is below that of the pad solder (for the leads 38) so that on dis-assembly, the chips are released from the heat sink before the seal solder loosens. Otherwise, with the chips still attached but the heat sink assembly and the substrate assembly loose, the TAB leads 38 or power studs 60 could be bent improperly. The heat cycle of the final seal will be sufficient to solder the chips to the heat sink, which step might be aided by pumping heated gas through the heat sink.

Disassembly is not necessarily the reverse of the assembly procedure described above. The package 10 of the present invention is heated to the melting point of solder of the square gasket 22 and 28, and the lid 20 is removed to expose the nuts 62. At this temperature, the lower square gasket 28, the chips 36, the power studs 60, and capacitors 72, and the power redistribution decal 64 all remain fixed to the substrate-interconnect of the surface 34. Then, all of the nuts 62 are removed and the package is reheated slightly above the melting point of the solder of the gaskets 22 and 28. If the capillaries 74 have been used, they preferably are flooded with oil so the whole is immersed in oil at the melting temperature of solder of the gaskets 22 and 28. If capillaries are not used, the solder between the chips 36 and the heat sink assembly 12 simply melts. In either case, the heat sink assembly 12 is slid off the power studs 60, exposing the chips 36. Replacement of individual chips may be done without disturbing other chips, the capacitors, the power redistribution decal or the power studs. Of course, appropriate tools may be employed for manual or semi-manual operation to resolder the TAB leads 38 and to rebond new chips and TAB leads to the substrate-interconnect.

As partially illustrated in FIGS. 2 and 5, external cooling fluid may be provided to and removed from the package 10 by any suitable arrangement. As illustrated, a harness 80 provided with any suitable seal 82 such as formed from an elastomeric material and the like may be urged into engagement with the fluid inlet 14 and the fluid outlet 16. Preferably, at least one check valve in the mating structure 80 is provided so that upon disconnection of the external structure 80, coolant does not flow therefrom.

The fluid-cooled protective package of the present invention may be operated within broad ranges of waste heat dissipation as for example up to 1000 watts per square centimeter of chip (lateral size) with 50 psi pressure drop. However, if the pressure drop of cooling fluid through the package is on the order of five pounds per square inch so as to reduce pressure-related strains on the layers of the package, heat transfers of approximately 100 watts per square centimeter of chip lateral surface area are achievable. Ultimately, a balance must be achieved between power dissipation and mechanical strength of structural layers of the package such as the very thin dimensions of layers of the heat sink assembly. That is, the thinner the walls of the heat sink layers, the less heat that may be removed because of the relatively lower pressure drops permitted by mechanical strength of such layers.

The present invention, therefore, is well adapted to carry out the objects and obtain the ends and advantages mentioned as well as others inherent therein. While presently preferred embodiments of the invention have been given for the purpose of disclosure, numerous changes in the details of construction and arrangement of parts may be made without departing from the spirit of the invention and the scope of the appended claims.

What is claimed is:

1. The method of forming a fluid-cooled integrated circuit package having a planar substrate member, a plurality of integrated circuit chips, a heat sink member in a generally parallel plane with the substrate, a closure member abutting the heat sink comprising, soldering the integrated circuit chips to the substrate member with a first solder having a predetermined melting point, soldering the substrate member to the heat sink with a solder having a melting point lower than the melting point of the first solder, and soldering the closure member to the heat sink with a solder having a melting point lower than the melting point of the first solder.

2. The method of claim 1 including, soldering the heat sink to the integrated circuit chips with a solder having a melting point lower than the melting points of all of the solders.

3. The method of forming a fluid-cooled integrated circuit package having a planar substrate member, a plurality of integrated circuit chip members, a heat sink member in a generally parallel plane with the substrate, a closure member abutting the heat sink comprising, applying a first solder having an identifiable melting point between the integrated circuit chips and the planar substrate member for soldering the chips to the substrate, applying a second solder, having a lower melting point than the first solder, between the substrate member and the heat sink, applying a third solder, having a lower melting point than the first solder, between the closure member and the heat sink for soldering the closure member to the heat sink, and heating all of the members to melt all of the solders and join the member.

* * * * *